(12) United States Patent
Tsutsui et al.

(10) Patent No.: US 8,976,980 B2
(45) Date of Patent: Mar. 10, 2015

(54) MODULATION OF AUDIO SIGNALS IN A PARAMETRIC SPEAKER

(75) Inventors: Ryo Tsutsui, Tokyo (JP); Keitaro Hashimoto, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 357 days.

(21) Appl. No.: 13/427,614

(22) Filed: Mar. 22, 2012

(65) Prior Publication Data

US 2012/0243708 A1 Sep. 27, 2012

Related U.S. Application Data

(60) Provisional application No. 61/467,047, filed on Mar. 24, 2011.

(51) Int. Cl.
*H03G 5/00* (2006.01)
*H03C 1/00* (2006.01)

(52) U.S. Cl.
CPC .............. *H03C 1/00* (2013.01); *H04R 2217/03* (2013.01)
USPC ................... 381/98; 381/4; 381/15; 708/404; 708/321; 700/94

(58) Field of Classification Search
CPC .. H04R 3/04; H04R 2499/13; H04R 2430/03; H04R 2430/20; H04R 2430/21; H04R 2430/23; H04R 2430/25; H04R 2227/001; H04R 2227/009; H04R 2203/00; H04R 2203/12; H04R 2201/34; H04R 2201/40; H04R 2201/401; H04R 2201/403; H04R 2201/405; H04R 1/323; H04R 1/345; H04R 1/347; H04S 2420/07; H04S 2420/03; G11B 20/10037; G11B 20/10212; G11B 20/20; G11B 20/22; G11B 19/127; G11B 17/00
USPC ........ 381/1, 4, 7, 14, 15, 16, 19, 22, 23, 23.1, 381/316, 317, 320, 321, 94.2, 94.3, 94.4, 381/94.9, 97, 98, 100, 103; 700/94; 708/403, 404, 405, 322, 320, 317, 315, 708/313, 300

See application file for complete search history.

(56) References Cited

U.S. PATENT DOCUMENTS 3,900,823 A * 8/1975 Sokal et al. .................... 330/149
3,908,090 A * 9/1975 Kahn ............................. 381/16
(Continued)

FOREIGN PATENT DOCUMENTS

JP 2006-135778 5/2006

OTHER PUBLICATIONS

Wang et al, "Defining the Parameters of Truncated Square-rooting DSB for Parametric Loudspeaker", Proceedings of the 2007 IEEE International Conference on Mechatronics and Automation, Aug. 5-8, 2007, p. 1689-1693.*

(Continued)

*Primary Examiner* — Leshui Zhang
(74) *Attorney, Agent, or Firm* — Mirna Abyad; Frederick J. Telecky, Jr.

(57) ABSTRACT

Methods and systems for amplitude modulation in a parametric speaker system are provided that perform truncated double sideband (TDSB) frequency modulation of audio signal in which most of the processing is performed in the frequency domain, thus permitting use of fast processing techniques for amplitude modulation (AM) and filtering and reducing computation cost over time domain processing. A maximum envelope value of the time domain audio signal may be to the carrier signal in the frequency domain that avoids emitting the carrier signal when the input signal level is low or mute. The application of the envelope value may be smoothed to reduce discontinuity at input block boundaries.

20 Claims, 8 Drawing Sheets

(56) References Cited

U.S. PATENT DOCUMENTS

| | | | | |
|---|---|---|---|---|
| 4,703,462 | A | * | 10/1987 | Woodsum .................... 367/92 |
| 6,173,062 | B1 | * | 1/2001 | Dibachi et al. ............... 381/312 |
| 6,584,205 | B1 | | 6/2003 | Croft, III et al. |
| 7,162,042 | B2 | | 1/2007 | Spencer et al. |
| 7,181,025 | B2 | | 2/2007 | Kolano et al. |
| 7,729,498 | B2 | | 6/2010 | Spencer et al. |
| 8,275,137 | B1 | * | 9/2012 | Liu et al. ..................... 381/61 |
| 2001/0024475 | A1 | * | 9/2001 | Kumar ........................ 375/270 |
| 2003/0185405 | A1 | * | 10/2003 | Spencer et al. ............... 381/77 |
| 2005/0152561 | A1 | * | 7/2005 | Spencer ....................... 381/77 |
| 2005/0248233 | A1 | * | 11/2005 | Pompei ........................ 310/322 |
| 2007/0092018 | A1 | * | 4/2007 | Fonseka et al. ............. 375/265 |
| 2008/0063214 | A1 | * | 3/2008 | Spencer et al. ............... 381/77 |

OTHER PUBLICATIONS

Tan et al "Distortion Analysis and Reduction for the Parametric Array", 124th Convention of Audio Engineering Society, May 17-20, 2008, p. 1-6.*

Chen et al "Research on an Improved Amplitude Modulation Method of Audio Directional Loudspeaker", Proceedings of the 2008 IEEE, p. 5-9.*

"TMS320C6727, TMS320C6726, TMS320C6722 Floating-Point Digital Signal Processors", Texas Instruments Incorporated, May 2005, pp. 1-114.

T. Kamakura et al, "Suitable Modulation of the Carrier Ultrasound for a Parametric Loudspeaker", Acustica, vol. 73, 1991, pp. 215-217.

H. O. Berktay, "Possible Exploitation of Non-Linear Acoustics in Underwater Transmitting Applications", Journal of Sound and Vibration, vol. 2 , Issue 4, Oct. 1965, pp. 435-461.

E. Tan et al, "Distortion Analysis and Reduction for the Parametric Array", Proc. 124th Audio Engineering Society Convention, May 17-20, 2008, Amsterdam, The Netherlands, pp. 1-6.

"Overlap-save method", Wikipedia, pp. 1-3, available at http://en.wikipedia.org/wiki/Overlap%E2%80%93save_method on Mar. 15, 2012.

"Overlap-add method", Wikipedia, pp. 1-4, available at http://en.wikipedia.org/wiki/Overlap-add_method on Mar. 15, 2012.

Y. Wang et al, "Defining the Parameter of Truncated Square-rooting DSB for Parametric Loudspeaker", Proceedings of the 2007 IEEE International Conference on Mechatronics and Automation, Aug. 5-8, 2007, Harbin, China, pp. 1689-1693.

S.Sakai et al, "Dynamic SSB Modulator for Parametric Loudspeaker", IEICE Transactions on Fundamentals of Electronics, Communications and Computer Sciences (Japanese Edition), vol. J91-A, No. 12, Dec. 1, 2008, pp. 1166-1173.

* cited by examiner

MODULATION OF AUDIO SIGNALS IN A PARAMETRIC SPEAKER

CROSS-REFERENCE TO RELATED APPLICATIONS

This application claims benefit of U.S. Provisional Patent Application Ser. No. 61/467,047, filed Mar. 24, 2011, which is incorporated by reference herein in its entirety.

BACKGROUND OF THE INVENTION

1. Field of the Invention

Embodiments of the present invention generally relate to modulation of audio signals in a parametric speaker.

2. Description of the Related Art

Parametric speakers or arrays are known to be attractive sound reproduction systems because of their sharp directional characteristics. In general, a parametric speaker is a sound emission system that creates sound by emitting high frequency ultrasonic waves made up of a carrier frequency and frequencies from modulation of an audio signal with the carrier frequency. The ultrasonic frequencies are demodulated in air or another nonlinear medium to regenerate the audio signal. The parametric sound beam is highly directional and maintains audio intelligibility over long distances.

Parametric speaker technology is based on the well-known Berktay's 'demodulation' effect of ultrasonic propagation in the air which is described in H. O. Berktay, "Possible Exploitation of Nonlinear Acoustics in Underwater Transmitting Applications," J. Sound & Vib. 2, pp. 435-461, 1965. More specifically, if the ultrasonic signal $$p_1(t) = (1+s(t))\sin(\omega_c t) \quad (1)$$

is emitted in the air, a far-end listener would perceive audio signal as $$p_2(t) \propto \frac{\partial^2}{\partial t^2}(1 + 2s(t) + s(t)^2), \quad (2)$$

where s(t) is the input audio signal, and $\omega_c$ is the modulation carrier angular frequency high above the audio band. Eq. (2) suggests that the 'demodulation' effect reveals the input audio signal out of the ultrasonic signal, and also generates distortion due to the square term of the signal.

Various modified modulation techniques to use instead of Eq. (1) to eliminate the distortion term in Eq. (2) have been proposed. Two such techniques are described in T. Kamakura, et al., "Suitable Modulation of the Carrier Ultrasound for a Parametric Loudspeaker," ACUSTICA, 73, pp. 215-217, 1991, and E. L. Tan, et al., "Distortion Analysis and Reduction for the Parametric Speaker," *Proceedings of the 124th AES Convention,* May, 2008 ("Tan"). These techniques require that the transducer emit a wider ultrasonic bandwidth, which may be impractical in many cases. An alternative technique that cancels the distortion portion using simulated distortion is described in M. E. Spencer, et al., U.S. Pat. No. 7,729,498, entitled "Modulator Processing for a Parametric Speaker System," filed Jan. 9, 2007 ("Spencer"). This technique requires a module that exactly simulates the 'demodulation' effect of Eq. (2) and the robustness of the technique is unknown.

The techniques described in Tan and Spencer and the technique described in S. Sakai, et al., "Dynamic SSB Modulator for Parametric Loudspeaker," IEICE *Trans. Fundamentals (A),* vol. J91-A, No. 12, pp. 1166-1173, 2008 ("Sakai"), suggest use of a single sideband (SSB) frequency instead of the double sideband (DSB) frequencies of Eq. (1). Sakai explains the benefit of SSB, i.e., the square term in Eq. (2) is contributed by the upper and lower sidelobes generated by Eq. (2) and hence eliminating either may improve the sound quality. As is explained in Spencer and Y. Wang, et al., "Defining the Parameters of Truncated Square-rooting DSB for Parametric Loudspeaker," Proc IEEE, pp. 1689-1693, August, 2007, a similar effect to that of SSB can be expected by using Truncated DSB (TDSB) frequencies.

The previously mentioned techniques are all based on amplitude modulation (AM). The Japanese patent application JP2006-135778 proposes systems that instead use pulse width modulation (PWM) that can be implemented with a simple switching hardware circuit. However, the PWM based techniques may produce inferior sound quality as they generate more harmonics than using AM.

SUMMARY

Embodiments of the invention relate to methods and systems for amplitude modulation in a parametric speaker system. In one aspect, a method of amplitude modulation of an audio signal with a carrier signal in a parametric speaker system is provided that includes receiving a time domain sample block of the audio signal, overlapping the time domain sample block with a previous time domain sample block to generate an extended time domain sample block, applying a fast Fourier transform (FFT) to the extended time domain sample block to generate a frequency domain sample block, shifting a spectrum of the frequency domain sample block to generate a double sideband (DSB) frequency domain sample block, wherein a spectrum of the DSB frequency domain sample block consists of an upper sideband (USB) and a lower sideband (LSB) centered on a frequency of the carrier signal, applying a filter to the DSB frequency domain sample block using point-wise multiplication to generate a truncated DSB (TDSB) frequency domain sample block, wherein the filter truncates one selected from the group consisting of the LSB and the USB, adding the carrier signal to the TDSB frequency domain sample block to generate an amplitude modulated (AM) TDSB frequency domain sample block, applying an inverse FFT to the AM-TDSB frequency domain sample block to generate an AM-TDSB time domain sample block, and extracting a center set of samples of the AM-TDSB time domain sample block, wherein the center set of samples is a same size as the received time domain sample block.

In one aspect, a method of amplitude modulation of an audio signal with a carrier signal in a parametric speaker system is provided that includes receiving a time domain sample block of the audio signal, applying a fast Fourier transform (FFT) to the time domain sample block to generate a frequency domain sample block, wherein the time domain sample block is padded with zeros to a length of the FFT, shifting a spectrum of the frequency domain sample block to generate a double sideband (DSB) frequency domain sample block, wherein a spectrum of the DSB frequency domain sample block consists of an upper sideband (USB) and a lower sideband (LSB) centered on a frequency of the carrier signal, applying a filter to the DSB frequency domain sample block using point-wise multiplication to generate a truncated DSB (TDSB) frequency domain sample block, wherein the filter truncates one selected from the group consisting of the LSB and the USB, adding the carrier signal to the TDSB frequency domain sample block to generate an amplitude modulated (AM) TDSB frequency domain sample block, applying an inverse FFT to the AM-TDSB frequency domain sample block to generate an AM-TDSB time domain sample block, and overlapping a portion of the AM-TDSB time domain sample block with a portion of an AM-TDSB time domain sample block generated for a previous time domain sample block to generate a final output sample block of a same size as the received time domain sample block.

In one aspect, a signal processor for a parametric speaker system is provided that includes a central processing unit, an audio port configured to receive an audio signal, and a memory coupled to the central processing unit, wherein the memory is configured to store software instructions. The software instructions, when executed by the central processing unit, cause the signal processor to perform amplitude modulation of the audio signal with a carrier signal, the amplitude modulation including receiving a time domain sample block of the audio signal, overlapping the time domain sample block with a previous time domain sample block to generate an extended time domain sample block, applying a fast Fourier transform (FFT) to the extended time domain sample block to generate a frequency domain sample block, shifting a spectrum of the frequency domain sample block to generate a double sideband (DSB) frequency domain sample block, wherein a spectrum of the DSB frequency domain sample block consists of an upper sideband (USB) and a lower sideband (LSB) centered on a frequency of the carrier signal, applying a filter to the DSB frequency domain sample block using point-wise multiplication to generate a truncated DSB (TDSB) frequency domain sample block, wherein the filter truncates one selected from the group consisting of the LSB and the USB, adding the carrier signal to the TDSB frequency domain sample block to generate an amplitude modulated (AM) TDSB frequency domain sample block, applying an inverse FFT to the AM-TDSB frequency domain sample block to generate an AM-TDSB time domain sample block, and extracting a center set of samples of the AM-TDSB time domain sample block, wherein the center set of samples is a same size as the received time domain sample block.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1A:
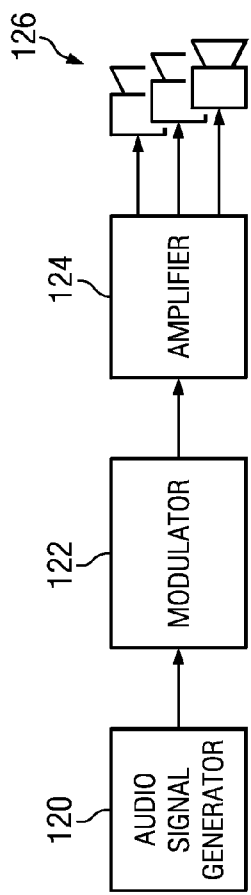
FIG. 1A is a block diagram of a parametric speaker system.

Specific embodiments of the invention will now be described in detail with reference to the accompanying figures. Like elements in the various figures are denoted by like reference numerals for consistency.

When modulation is performed in the time domain for a parametric speaker as in many prior art techniques, the computation cost may be high due to a high sampling rate needed to deal with the ultrasonic signal. Embodiments of the invention provide for truncated double sideband (TDSB) frequency modulation of audio signals in a parametric speaker in which most of the processing is performed in the frequency domain, thus permitting use of fast processing techniques for amplitude modulation (AM) and filtering and reducing computation cost over time domain processing. Some embodiments apply an envelope to the carrier signal in the frequency domain that avoids emitting the carrier signal when the input signal level is low or mute. The application of the envelope may be smoothed to reduce discontinuity at input block boundaries.

FIG. 1A shows a simplified block diagram of a parametric speaker system. The audio signal generator 120 provides an audio signal to a modulator 122 that performs amplitude modulation on the audio signal. The amplitude modulation is performed in the frequency domain in accordance with embodiments described herein. The modulated audio signal is provided to an amplifier 124 which amplifies the signal and provides it to a transducer array 126 for emission. While FIG. 1A shows only a single amplifier, multiple amplifiers may be employed, each of which may drive one or more transducers.

Figure 1B:
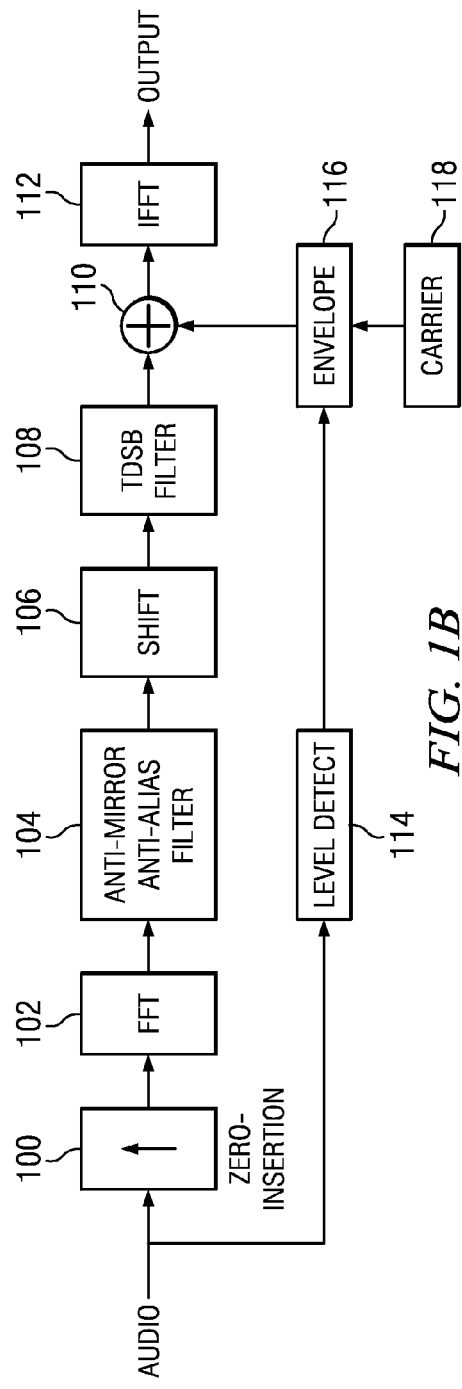
FIG. 1B is a block diagram of an amplitude modulation system for use in the parametric speaker system of FIG. 1A.

FIG. 1B shows a block diagram of an amplitude modulation system, e.g., the modulator 122 of FIG. 1A, for use in a parametric speaker. While this diagram includes a zero-insertion component 100, an anti-mirror anti-alias filter component 102, a level detection component 114, and an envelope component 116, one or more of these components may not be used in other embodiments. The system adopts the well-known overlap-save technique (also referred to as overlap-discard or overlap-scrap) for efficient application of filters to the audio signal in the frequency domain. The use of overlap-save allows the filtering to be performed with point-wise multiplication in the frequency domain.

Figure 2A:
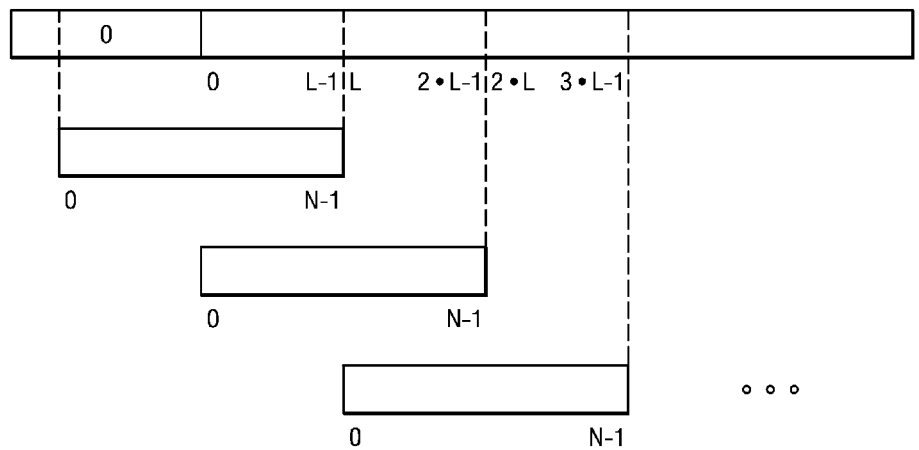
FIG. 2A is an example of overlapping input sample blocks.

In general, for overlap-save, given an N point FFT and an input sample block size of L samples, where N>L, the input sample block is extended by N−L values taken from the immediately preceding input sample block. That is, the input sample blocks are overlapped to generate overlapped sample blocks of N samples. In a sense, the last N−L values of the preceding input sample block are "saved" for extending the next input sample block. FIG. 2A shows an example of the overlapping.

Figure 2B:
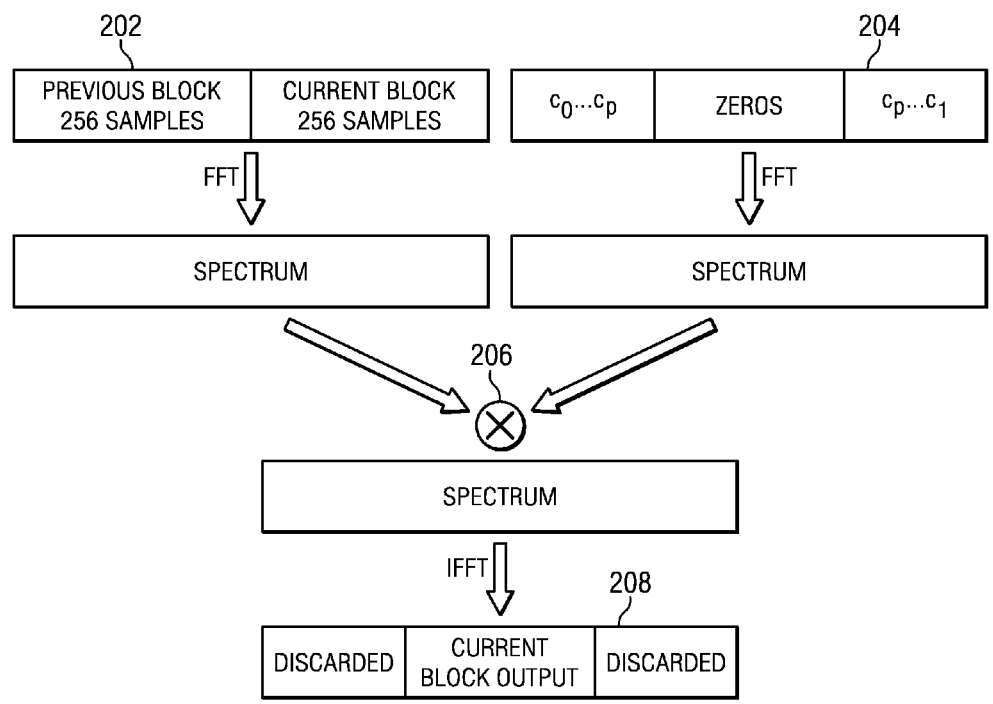
FIG. 2B is an example of an overlap-save technique.

FIG. 2B shows an example of the general overlap-save technique with a 50% overlap of the input signal. For example purposes, N=512, L=256, and the overlap N−L=256. The order P of the filter is less than or equal to the overlap size, i.e., P≤N−L≤256. The current block of 256 samples is extended with 256 samples of the previous block to generate an overlapped sample block 202 of 512 samples. The P-order filter is also extended to generate a 512-order filter 204. To generate the 512-order filter, the P filter coefficients are reversed and zero-padded as shown in the figure. A 512-point FFT is then applied the overlapped sample block 202 and the 512-order filter 204. The resulting spectrums are then point-wise multiplied 206. A 512-point IFFT is then performed on the resulting spectrum to generate a time domain block 208 of 512 samples. The final 256 sample output block is generated by taking the center 256 samples of the 512 sample block 208.

Referring back to FIG. 1, the zero-insertion component 100 oversamples the digital input audio signal by performing zero-insertion on the time domain input signal. The zero-insertion may be performed to ensure that the output sampling frequency is high enough, e.g., 192 kHz, to contain an ultrasonic signal around the modulation carrier, e.g., 40 kHz, because in many audio systems, the audio data is sampled for audio bandwidth, e.g., 48 kHz. Any suitable zero-insertion may be used. For example, in one embodiment, three zeroes are inserted between every two samples. In another example, when the input signal is sampled at 16 kHz (e.g., speech bandwidth), the signal may be oversampled by factor of 12 to 192 kHz, i.e., 11 zeros may be inserted between every two samples. Note that it is not necessary to oversample to 192 kHz. Any sufficiently-high sampling rate, e.g., 160 kHz, that is capable of containing an ultra-sonic signal may be used.

The fast Fourier transform (FFT) component 102 applies an FFT to the oversampled digital audio signal to convert the signal to the frequency domain. Converting the signal from the time domain to the frequency domain reduces the computational costs of the other components, particularly the filter components 104, 108. The FFT component 102 applies the FFT to the signal according to the overlap-and-save technique. Any suitable FFT length and overlap length may be used. However, the overlap length should be greater than or equal to the sum of the orders of the filters used in the filter components 104, 108 in order to eliminate the circular portion of the FFT. In some embodiments, the FFT length is 512, the sample block size is 256, and the overlap is 50% or 256 samples.

The anti-mirror anti-alias filter component 104 applies a low-pass filter to the frequency domain sample block. The low pass filter may be designed to both suppress mirror images that may have been introduced by the oversampling of the time domain sample block and to be band-limiting to avoid the introduction of aliasing by the shift component 106. As was previously mentioned, if the input sampling rate is high enough, the zero-insertion component 100 is not needed. In such cases, the filter component 104 may also be eliminated. However, if the input signal is a full bandwidth signal having an effective bandwidth up to the Nyquist frequency, the shift module 106 may shift the signal components above the Nyquist frequency, causing serious aliasing. In such instances, the filter component 104 may be retained even in the absence of the zero-insertion component 100 in order to band limit the sample blocks to avoid the aliasing.

Figure 7:
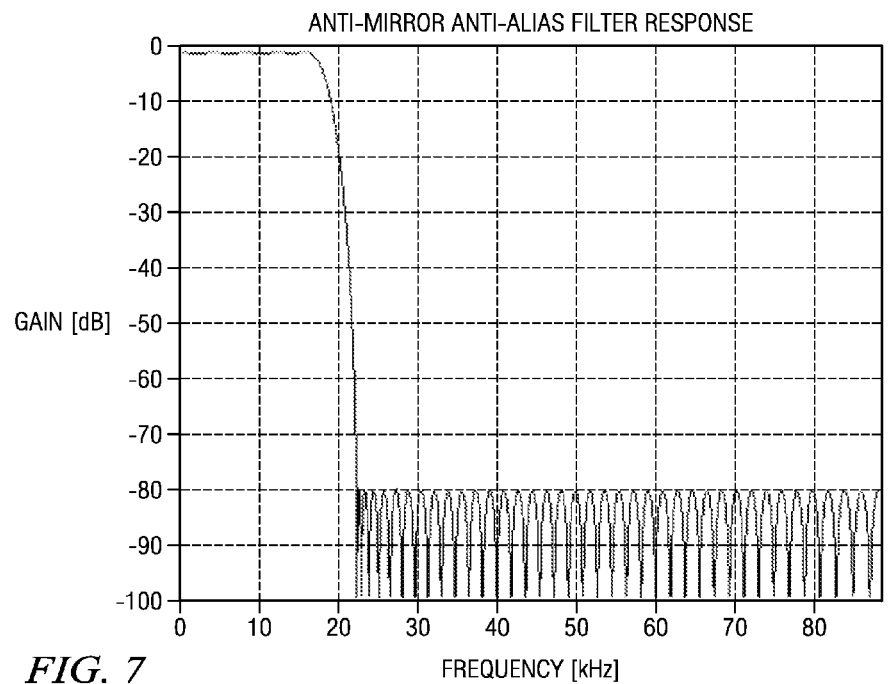
FIGS. 7 and 8 are graphs of example filter responses.

Any suitably designed low pass filter may be used. Recall that the sum of orders of this low pass filter and the filter of the TDSB filter component 108 should be less than or equal to the length of the input sample overlap. To apply the filter to the frequency domain sample block, the filter length is extended to the length of the original FFT, an FFT of the same length is applied to the extended filter to generate frequency domain coefficients, and the frequency domain coefficients and the frequency domain sample block are point-wise multiplied. To extend the filter length, the coefficients are reversed and appended to the original coefficients. Zero padding is inserted as needed between the original and reversed coefficients to attain the correct length. For example, assume the filter length is 2P+1, the coefficients of the symmetric filter are $c_P, \ldots, c_0 \ldots c_P$, and the frequency sample block size is L. The extended filter will be $c_0 \ldots c_P$<L-2P-1 zeroes>$c_P \ldots c_1$. In some embodiments, the low pass filter is an order-94 low-pass filter with the frequency response shown in FIG. 7.

The shift component 106 shifts the spectrum in the frequency domain sample block to generate a spectrum with two sidebands, an upper sideband (USB) and a lower sideband (LSB), centered on the carrier frequency, i.e., a double sideband (DSB) spectrum.

The continuous time formula of Eq. (1) can be modified to the discrete time formula of Eq. (3):

$$p_n(n) = s(n)\cos(\omega_c n) + \cos(\omega_c n). \quad (3)$$

where $s(n)\cos(\omega_c n)$ is the input audio signal and $\cos(\omega_c n)$ is the carrier signal. The shift component performs the frequency domain equivalent of $s(n)\cos(\omega_c n)$ on the frequency domain sample block. In the frequency domain, the term $s(n)\cos(\omega_c n)$ is equivalent to an operation that shifts the input spectrum upward and downward around the carrier frequency at each sample and adds the shifted sample values to generate the DSB sample values.

Accordingly, the shift component 106 generates a DSB frequency domain sample block from the frequency domain sample block according to Eq. (4)

$$Y(k) = X(k-N_c) + X(k+N_c), \quad (4)$$

where $X(k)$ for $k=0, 1, \ldots, N-1$ is the input spectrum, N is the FFT length, and $$N_c = \frac{F_c}{F_s} N$$

($F_c$ is the carrier frequency, $F_s$ is the output sample frequency) is the integer frequency bin index corresponding to the carrier frequency, i.e., the shift amount. The calculated indices of the frequency bins are constrained to the range $0, \ldots, N-1$. For example, $Y(k) = X(k+N-N_c) + X(k+N_c)$ if $k-N_c < 0$ and $Y(k) = X(k-N_c) + X(k+N_c-N)$ if $k+Nc >= N$.

The truncated double sideband (TDSB) filter 108 component applies a filter the DSB frequency domain sample block to produce a truncated DSB signal, i.e., a TDSB frequency domain sample block. In some embodiments, a high pass filter is used which truncates the lower sideband of the DSB signal so that nearly all of the frequencies passed are above the carrier. In some embodiments, a low pass filter is used which truncates the upper sideband of the DSB signal so that nearly all of the frequencies pass are below the carrier. For example, a 256 order high-pass filter with a 39 kHz cut-off frequency may be used when the modulation frequency is 40 kHz.

Figure 8:
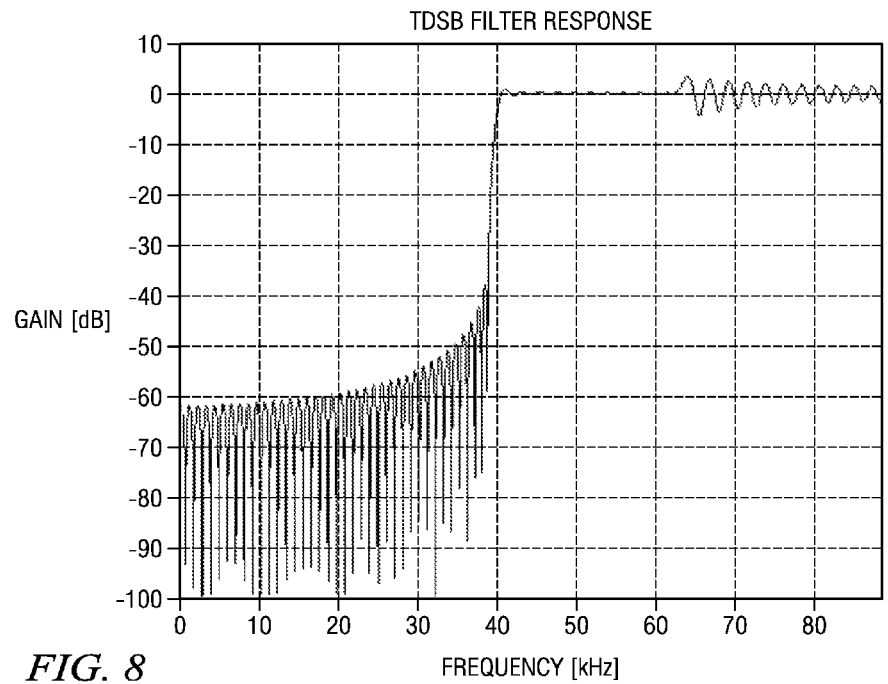

Any suitably designed low pass or high pass filter may be used. Recall that the sum of orders of the low-pass filter used by the filter component 104 and the filter of the TDSB filter component 108 should be less than or equal to the length of the input sample overlap. In addition, the cut-off frequency of either filter should be approximately the modulation frequency. For example, a 39 kHz cut-off frequency may be used when the modulation frequency is 40 kHz. To apply the filter to the frequency domain sample block, the filter length is extended to the length of the original FFT, an FFT of the same length is applied to the extended filter to generate frequency domain coefficients, and the frequency domain coefficients and the frequency domain sample block are point-wise multiplied. To extend the filter length, the coefficients are reversed and appended to the original coefficients. Zero padding is inserted as needed between the original and reversed coefficients to attain the correct length. For example, assume the filter length is P, the coefficients of the symmetric filter are $cp, \ldots c_0 \ldots c_P$, and the frequency sample block size is L. The extended filter will be $c_0 \ldots c_P$<L-P zeroes>$c_p \ldots c_1$. In some embodiments, the TDSB filter is an order 162 high pass filter with the frequency response shown in FIG. 8. In some embodiments, if the filter component 104 is present, a high-pass TDSB filter may have a don't-care band above the lowest frequency suppressed by the low-pass filter of the filter component 104.

The carrier component 118 generates the carrier signal to be added to the TDSB frequency domain sample block to complete the amplitude modulation. In the frequency domain, the carrier signal is FFT'd to a unit sample (a constant value at the carrier frequency). Thus, to add the carrier signal to the TDSB frequency domain sample block, a value of one (1) should be added to the frequency bins of the TDSB block corresponding to the positive and negative carrier frequency, and nothing should be added to the other bins. Accordingly, the carrier signal module computes $$\delta(k+N_c)+\delta(k-N_c),$$

where N is the FFT length, k=0, 1, . . . , $$N-1, N_c = \frac{F_c}{F_s}N$$

($F_c$ is the carrier frequency, $F_s$ is the output sample frequency) is the integer frequency bin index corresponding to the carrier frequency, and $\delta(n)$ is the Kronecker's delta, i.e., $\delta(n)=1$ if n=0 and $\delta(n)=0$ if n≠0. The calculated frequency bin indices are confined in the range 0, 1, . . . , N−1 by taking the remainder of division by N (modulo). Accordingly, $\delta(k+N_c)=1$ only if $k=N-N_c$ and $\delta(k-N_c)=1$ only if $k=N_c$. Thus, $\delta(k+N_c)+\delta(k-N_c)=1$ if $k=N_c$ or $k=N-N_c$; otherwise $\delta(k+N_c)+\delta(k-N_c)=0$. Note that $k=N-N_c$ is equivalent to $k=-N_c$ which is the negative carrier frequency.

Figure 5:
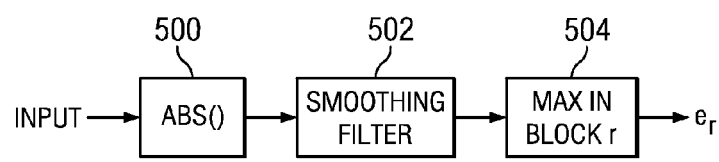
FIG. 5 is a flow diagram of a method for detecting an envelope level.

The level detection component 114 determines the signal level of a time domain sample block of the original audio. That is, the level detection module determines an envelope level of the time domain sample block. Any suitable level detection algorithm may be used. FIG. 5 is a flow diagram of a level detection method that may be used in some embodiments. As shown in FIG. 5, the absolute value 500 of the samples in the sample block is computed, a smoothing filter 502, e.g., a first order IIR filter, is applied, and the maximum sample value 504 of the sample block is determined. This maximum value is selected as the envelope level and is provided to the envelope component 116.

The envelope component 116 suppresses the carrier signal from the carrier component 118 when the input signal level is low. This suppression may be expressed as $$p_1(n)=s(n)\cos(\omega_c n)+e(n)\cos(\omega_c n), \quad (5)$$

where e(n) is an envelope of the input signal. Due to the frequency domain processing of the input sample blocks, a single envelope value, $e_r$, at the r-th block as determined by the level detection component 114 is used for carrier signal suppression. Accordingly, in some embodiments, the envelope component 116 applies the suppression to the output of the carrier signal component 118 by computing $e_r\{\delta(k+N_c)+\delta(k-N_c)\}$ where $\delta(k+N_c)+\delta(k-N_c)$ is the output of the carrier component 118. As previously mentioned, N is the FFT length, k=0, 1, . . . , $$N-1, N_c = \frac{F_c}{F_s}N$$

($F_c$ is the carrier frequency, $F_s$ is the output sample frequency) is the integer frequency bin index corresponding to the carrier frequency, and $\delta(n)$ is the Kronecker's delta. Note that since the carrier component 118 outputs a 1 only for $k=N_c$ or $k=N-N_c$ and a 0 otherwise, the output of the envelope component 116 in such embodiments will be $e_r$ for the frequency bins corresponding to the positive and negative carrier frequencies and will be 0 otherwise.

Figure 3:
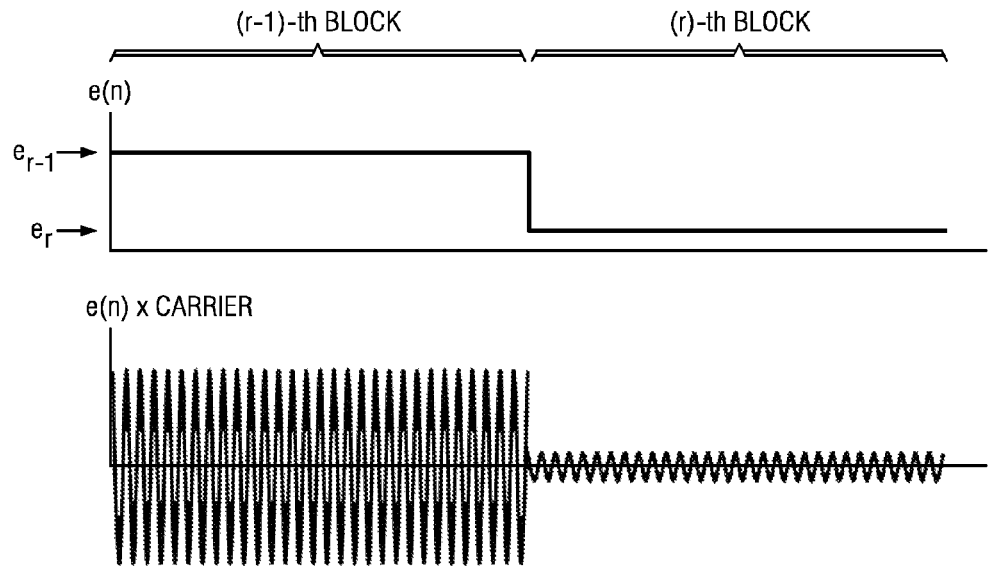
FIG. 3 is an example of carrier signal discontinuity at sample block boundaries.

Suppressing the carrier signal level in this manner may cause discontinuity of the carrier signal at block boundaries, leading to audible artifacts known as "pop-noise." FIG. 3 is an example illustrating this problem. If the input signal suddenly drops very low at the r-th block, the envelope e(n) will follow it and reduce the envelope level from $e_{r-1}$ to $e_r$ at the block boundary. Thus, discontinuity may occur if the carrier signal is suppressed according to $e_r\{\delta(k+N_c)+\delta(k-N_c)\}$.

Figure 4:
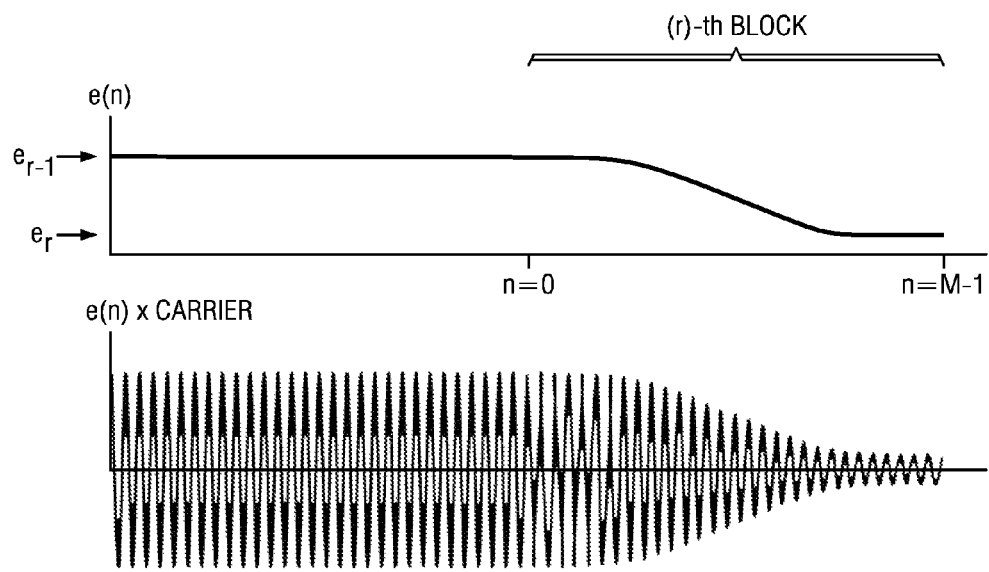
FIG. 4 is an example of smoothing the envelope at sample block boundaries to produce a continuous carrier signal.

To avoid this effect, instead of applying the actual value of $e_r$ to the r-th block, the value can be "smoothed" across blocks as in Eq. (6):

$$e(n) = \frac{e_{r-1}+e_r}{2} + \frac{e_{r-1}-e_r}{2}\cos\left(\pi\frac{n}{M}\right), \quad (6)$$

where M is the block length and n=0, 1, . . . , M−1. FIG. 4 illustrates that e(n) smoothly changes at the frame boundary and therefore $e(n)\cos(\omega_c n)$ will be continuous.

The 'smoothed' envelope scheme of Eq. (6) can be implemented efficiently in frequency domain. For example, for overlap-and-save as described in FIG. 2B, the term $$\cos\left(\pi\frac{n}{M}\right)$$

in Eq. (6) can be extended to the FFT window length, i.e., $$e(n) = \frac{e_{r-1}+e_r}{2} + \frac{e_{r-1}-e_r}{2}\sin\left(2\pi\frac{n}{N}\right), \quad (7)$$

where N=2M is the FFT length and n=N/4, . . . , 3N/4−1, i.e., the final output samples extracted from the IFFT result. As is shown in FIG. 2B, there are N IFFT'd samples and the output samples are extracted from the center of these N samples which is in the range [N/4 . . . 3N/4−1]. Eq. (6) says the envelope shapes the cosine where samples are valid for output. Thus, Eq. (7) is correct because it shapes cosine in the range [N/4–3N/4−1].

The envelop smoothing of Eq. (7) may be applied to the carrier signal by $$\frac{e_{r-1}+e_r}{2}\{\delta(k+N_c)+\delta(k-N_c)\}+ \quad (8)$$

$$\frac{e_{r-1}-e_r}{2}\{\delta(k+N_c)+\delta(k-N_c)\}*FFT(\sin)$$

where * denotes convolution and $$FFT(\sin) = j\left(\frac{\{\delta(k-1)-\delta(k+1)\}}{2}\right)$$

where $j^2 = -1$.

Applying the convolution in Eq. (8), the smoothed envelope of Eq. (8) may be applied to the output of the carrier signal component 118 by computing $$\frac{e_{r-1} + e_r}{2} \{\delta(k + N_c) + \delta(k - N_c)\} - \quad (9)$$

$$j\frac{e_{r-1} - e_r}{4} \{\delta(k + N_c + 1) - \delta(k - N_c - 1)\} +$$

$$j\frac{e_{r-1} - e_r}{4} \{\delta(k + N_c - 1) - \delta(k - N_c + 1)\},$$

where $\delta(k+N_c)+\delta(k-N_c)$ is the output of the carrier component 118. As previously mentioned, N is the FFT length, k=0, 1, ... , $$N - 1, N_c = \frac{F_c}{F_s} N$$

($F_c$ is the carrier frequency, $F_s$ is the output sample frequency) is the integer frequency bin index corresponding to the carrier frequency, and $\delta(n)$ is the Kronecker's delta. As can be seen in Eq. (9), the smoothing of the envelop can be accomplished by modulating the carrier signal, which modulation can be implemented in the frequency domain by computing six Kronecker's deltas, just four more than are needed to generate the carrier signal.

As was previously explained, $\delta(k+N_c)+\delta(k-N_c)=1$ if $k=N-N_c$ or $k=N_c$; otherwise $\delta(k+N_c)+\delta(k-N_c)=0$. Further, $\delta(k+N_c+1)-\delta(k-N_c-1)=1$ if $k=N-(N_c+1)$ or $k=N_c+1$; otherwise $\delta(k+N_c+1)-\delta(k-N_c-1)=0$. In addition, $\delta(k+N_c-1)-\delta(k-N_c+1)=1$ if $k=N-(N_c-1)$ or $k=N_c-1$; otherwise $\delta(k+N_c-1)-\delta(k-N_c+1)=0$. Accordingly, the output of embodiments of the envelop component 116 with smoothing is $$\frac{e_{r-1} + e_r}{2}$$

when k=N-N$_c$ or $$k = N_c, -j\frac{e_{r-1} - e_r}{4}$$

when k=N-(N$_c$+1) or k=N$_c$+1, $$j\frac{e_{r-1} - e_r}{4}$$

when k=N-(N$_c$-1) or k=N$_c$-1, and is 0 otherwise. Note that the smoothed envelope values are generated for the frequency bins corresponding to the positive and negative carrier frequencies and the frequency bins immediately before and after the ones corresponding to the positive and negative carrier frequencies.

The adder component 110 adds the carrier signal to TDSB frequency domain sample block to generate the final amplitude modulated (AM) TDSB (AM-TDSB) frequency domain sample block. More specifically, in embodiments without the envelope component 116, the adder component computes $$Y(k)=X(k)+\{\delta(k+N_c)+\delta(k-N_c)\}, \quad (10)$$

where N is the FFT length, X(k) for k=0, 1, ... , N−1 is the input spectrum, $$N_c = \frac{F_c}{F_s} N$$

($F_c$ is the carrier frequency, $F_s$ is the output sample frequency) is the integer frequency bin index corresponding to the carrier frequency, and $\delta(n)$ is the Kronecker's delta, i.e., $\delta(n)=1$ if n=0 and $\delta(n)=0$ if n≠0. Note that $\delta(k+N_c)+\delta(k-N_c)$ is the output of the carrier component 118. In embodiments with the envelope component 116 with no smoothing, the adder component 110 computes:

$$Y(k)=X(k)+e_r\{\delta(k+N_c)+\delta(k-N_c)\} \quad (11)$$

where $e_r\{\delta(k+N_c)+\delta(k-N_c)\}$ is the output of the envelope component 116. In embodiments with the envelope component 116 and smoothing, the adder component 110 computes $$Y(k) = X(k) + \frac{e_{r-1} + e_r}{2}\{\delta(k + N_c) + \delta(k - N_c)\} - \quad (12)$$

$$j\frac{e_{r-1} - e_r}{4}\{\delta(k + N_c + 1) - \delta(k - N_c - 1)\} +$$

$$j\frac{e_{r-1} - e_r}{4}\{\delta(k + N_c - 1) - \delta(k - N_c + 1)\}$$

where $$\frac{e_{r-1} + e_r}{2}\{\delta(k + N_c) + \delta(k - N_c)\} -$$

$$j\frac{e_{r-1} - e_r}{4}\{\delta(k + N_c + 1) - \delta(k - N_c - 1)\} +$$

$$j\frac{e_{r-1} - e_r}{4}\{\delta(k + N_c - 1) - \delta(k - N_c + 1)\},$$

is the output of the envelope component 116.

The inverse fast Fourier transform (IFFT) component 112 applies an IFFT to the AM-TDSB frequency domain sample block generated by the adder component 110 to convert the signal to the time domain. The final time domain output block is generated by taking the center M samples of the IFFT output, where M is the block size of the original input, and discarding the rest.

Figure 6:
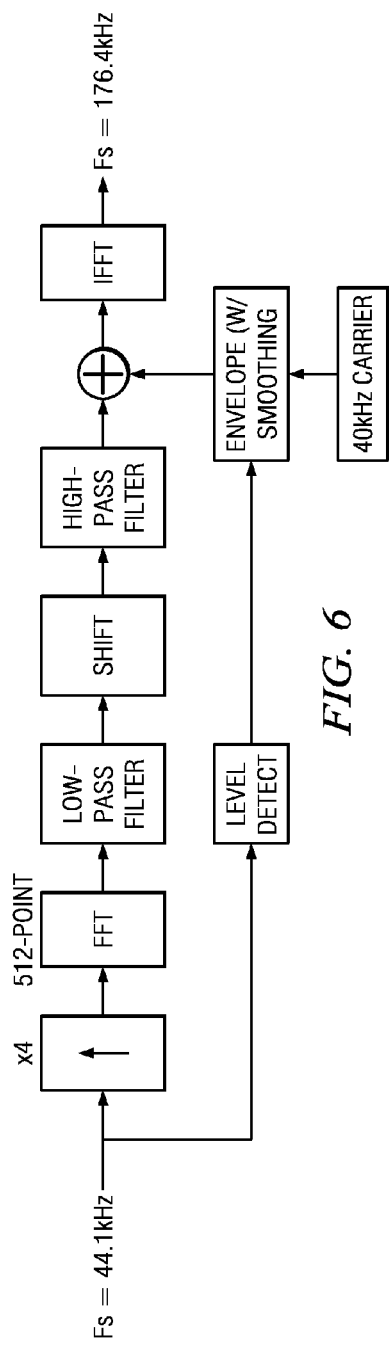
FIG. 6 is a block diagram of a test embodiment of the amplitude modulation system of FIG. 1B.

An embodiment of the amplitude modulation system of FIG. 1B configured as shown in FIG. 6 was tested. For the testing, the input sample rate was 44.1 kHz, ×4 oversampling was used (3 zeroes between every two samples), the output sample rate was 176.4 kHz, the input time domain sample block sizes was 256 samples, the FFT/IFFT length was 512, the overlap ratio was 50%, the carrier frequency was 40 kHz, and the shift amount was 116 bins (=512×40/176.4). The first filter component was an order-94 low-pass filter with the frequency response shown in FIG. 7. The stop band of this low pass filter starts at 22.05 kHz, which is the Nyquist frequency of the input signal. The second filter component was an order-162 high-pass filter shown in FIG. 8. This filter has a don't-care-band above 62 kHz because the components above 62 kHz are suppressed by the low pass filter.

Figure 9:
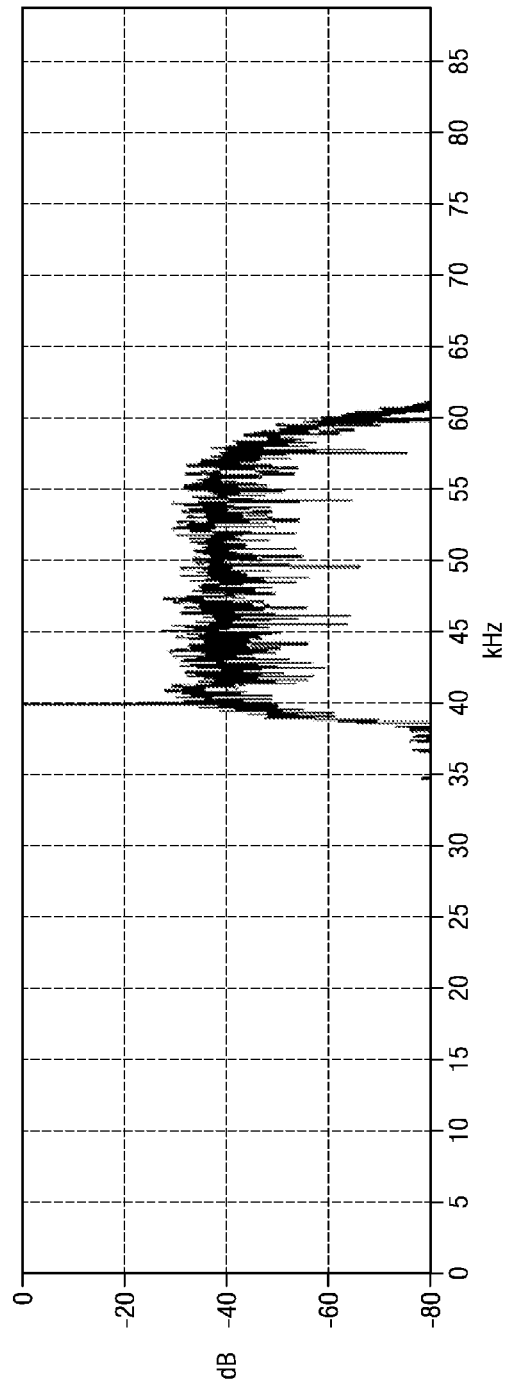
FIGS. 9 and 10 are graphs of results from the test embodiment of FIG. 6.
Figure 10:
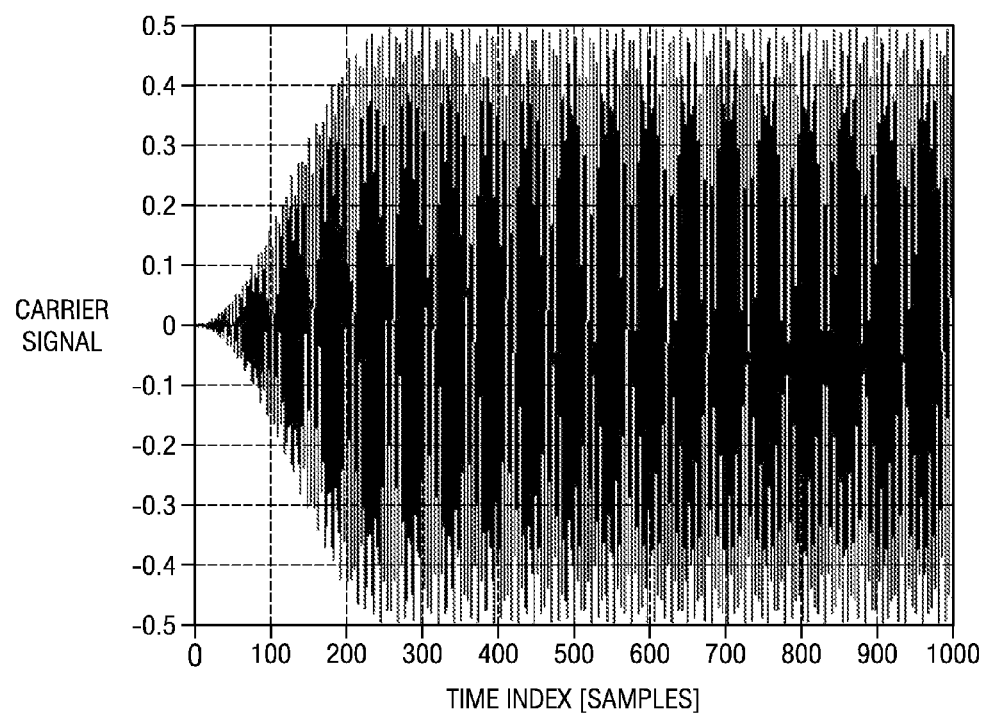

FIG. 9 shows the power spectrum of the output signal of the system of FIG. 6 for white noise input. This figure shows that the output signal has a carrier signal at 40 kHz and a USB above 40 kHz. FIG. 10 shows the carrier signal shape when the envelope value suddenly changes from 0 to 0.5. This figure shows that the envelope smoothly changes in the first block of 256 samples.

Figure 11:
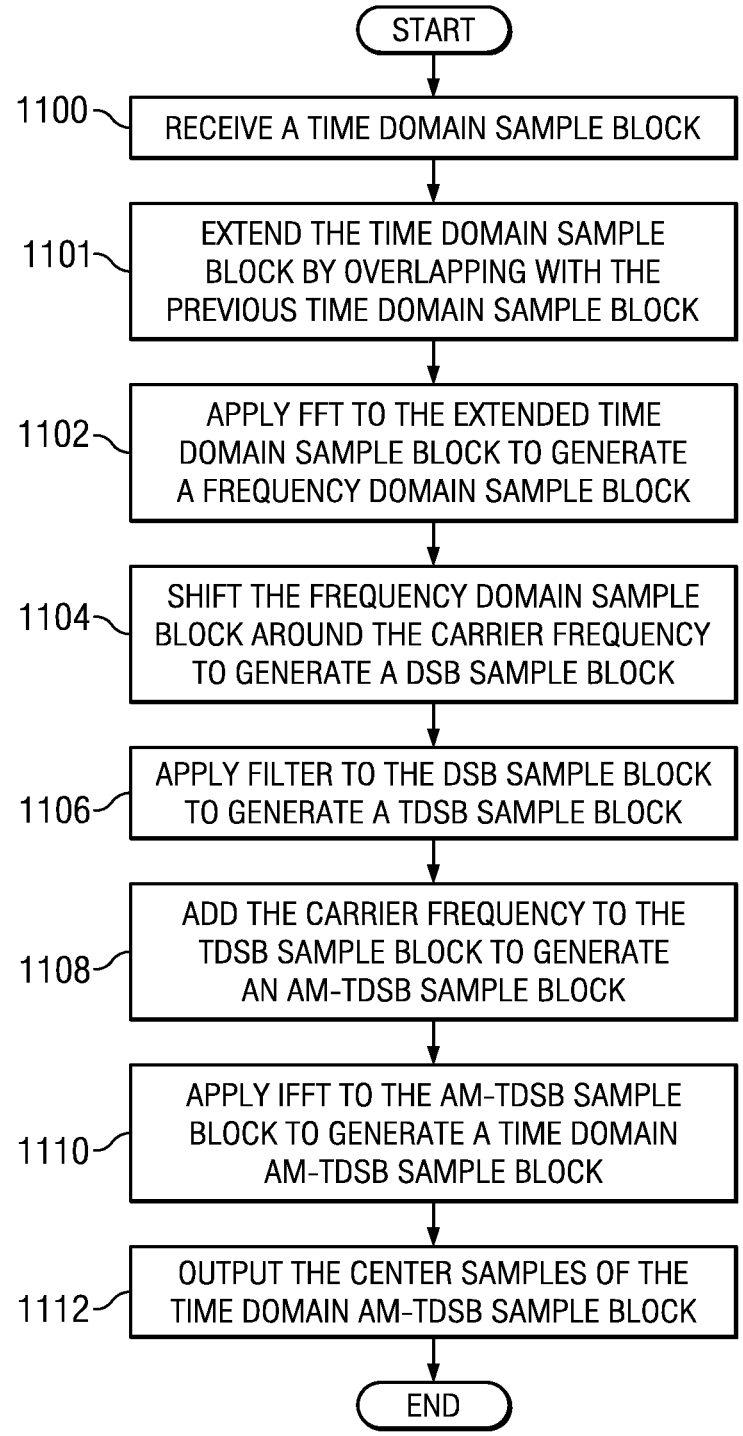
FIG. 11 is a flow diagram of a method for amplitude modulation.

FIG. 11 shows a flow diagram of a method for amplitude modulation in the frequency domain that can be used in a parametric speaker. Initially, a time domain sample block of M samples is received 1100, and the time domain sample block is extended 1101 to the FFT length L by overlapping the block with the previous time domain sample block. Extending a time domain sample block is previously described herein. An FFT of length L is performed 1102 on the extended time domain sample block to generate a frequency domain sample block of length L. The frequency domain sample block is then shifted 1104 around the carrier frequency to generate a double side band (DSB) frequency domain sample block. The DSB frequency domain sample block is generated as per Eq. (4).

A filter is then applied 1106 to the DSB frequency domain sample block to generate a truncated DSB (TDSB) frequency domain sample block. In some embodiments, a high pass filter is used which truncates the lower sideband of the DSB signal so that nearly all of the frequencies passed are above the carrier. In some embodiments, a low pass filter is used which truncates the upper sideband of the DSB signal so that nearly all of the frequencies passed are below the carrier. The cut-off frequency of either filter should be approximately the modulation frequency. To apply the filter to the DSB frequency domain sample block, the filter length is extended to the length L, an FFT of length L is applied to the extended filter to generate frequency domain coefficients, and the frequency domain coefficients and the frequency domain sample block are point-wise multiplied. Extension of the filter length is previously described herein.

The carrier frequency is then added 1108 to the TDSB frequency domain sample block to generate a final amplitude modulated (AM) TDSB (AM-TDSB) frequency domain sample block. In some embodiments, the carrier frequency is added as per Eq. (10). In some embodiments, an envelope level of the input time domain sample may be applied to the carrier signal to suppress the carrier signal when the input signal level is low. In such embodiments, the envelope level of the input sample is determined as previously described herein, and the carrier frequency is added as per Eq. (11). In some embodiments, the suppression of the carrier signal may be smoothed as previously described herein. In such embodiments, the envelope level of the input sample is determined as previously described herein, and the carrier frequency is added as per Eq. (12).

An IFFT of length L is then applied 1110 to the AM-TDSB frequency domain sample block to generate an AM-TDSB time domain sample block. The center M samples of this time domain sample block are extracted and output 1112 as the final amplitude modulated sample block.

In some embodiments, oversampling in the form of zero-insertion is performed on the time domain input signal prior to the overlapping to ensure that the output sample frequency is high enough, i.e., to convert the input audio sampling rate to an ultrasonic sampling rate. The zero-insertion may be performed as previously discussed herein. In some embodiments, a low-pass filter designed to both suppress mirror images that may have been introduced by the oversampling and to be band-limiting to avoid the introduction of aliasing by the shifting is applied after the FFT. In some embodiments, even if the oversampling is not performed, a low-pass filter designed to be band-limiting to avoid the introduction of aliasing by the shifting is applied after the FFT. To apply either of these filters, the filter length is extended to the length L, an FFT of length L is applied to the extended filter to generate frequency domain coefficients, and the frequency domain coefficients and the frequency domain sample block are point-wise multiplied. Extension of the filter length is previously described herein.

Figure 12:
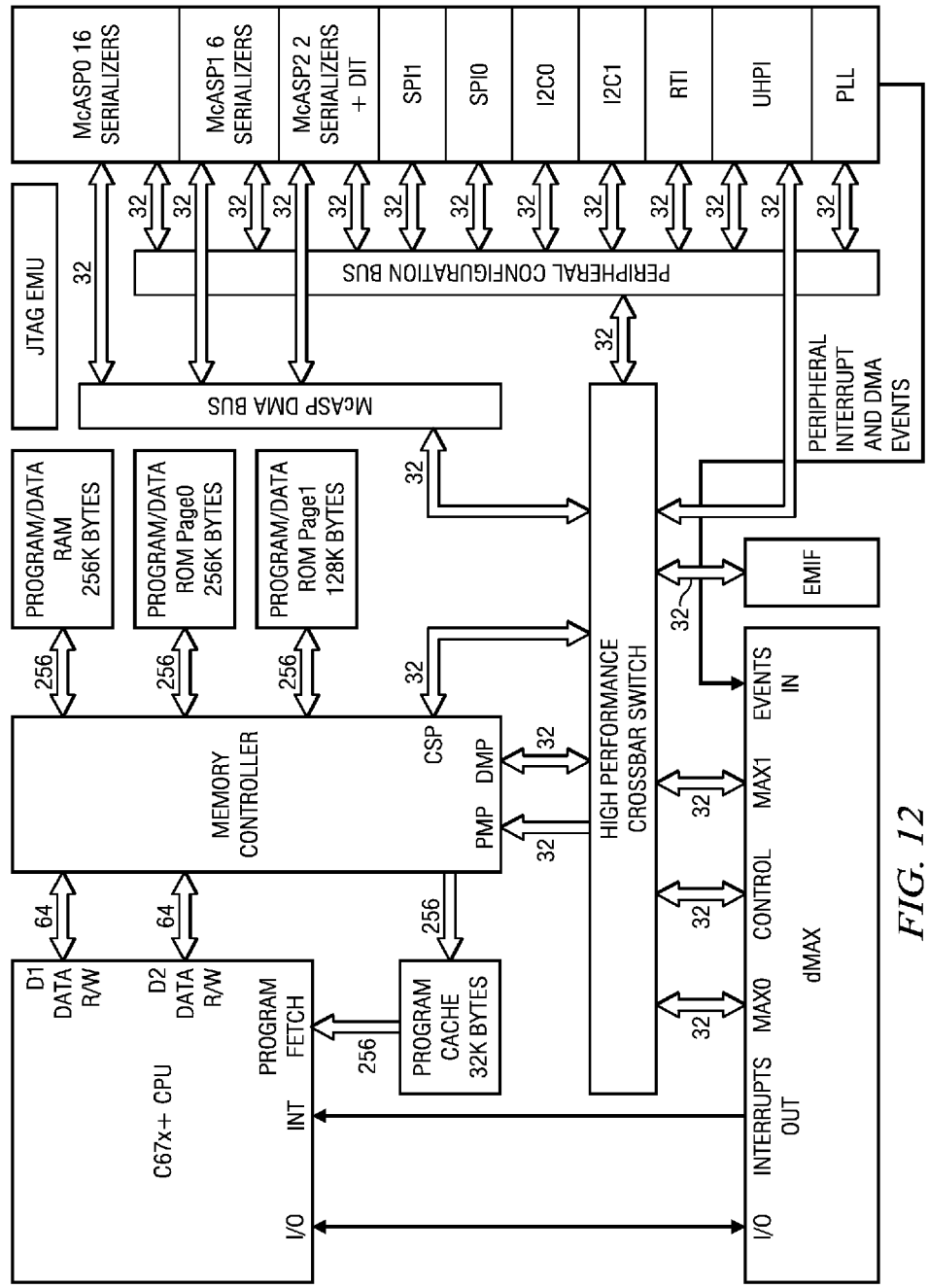
FIG. 12 is a block diagram of an example digital system.

FIG. 12 is a block diagram of an example digital system suitable for use in implementing a parametric speaker system that may be configured to perform an embodiment of frequency domain amplitude modulation as described herein. This example digital signal processor (DSP) is representative of one of a family of high-performance floating points DSPs available from Texas Instruments, Inc. The DSP is described in more detail in "TMS320C6727, TMS320C6726, TMS320C6722 Floating-Point Digital Signal Processors," SPRS268E, May 2005 or later, which is incorporated by reference herein.

The DSP includes a CPU capable of a maximum performance of 2400 MIPS/1800 MFLOPS by executing up to eight instructions (six of which may be floating point instructions) in parallel each cycle. The CPU natively supports 32-bit fixed-point, 32-bit single-precision floating-point, and 64-bit double-precision floating point arithmetic. The DSP also includes an efficient memory system (the memory controller and program cache). The memory controller maps the large on-chip 256K-byte RAM and 384K-byte ROM as unified program/data memory and supports single-cycle data accesses from the CPU to the internal RAM and ROM. The 32K-byte program cache provides a high cache hit rate for most applications.

The DSP also includes a high-performance crossbar switch, a dual data movement accelerator (dMAX), an external memory interface (EMIF), and multiple peripheral interface ports. The peripheral interface ports include three multichannel audio serial ports (McASPx). Each McASP supports the IIS format as well as variations, including time division multiplex (TDM) formats. Each McASP includes a transmit and receive section which may operate independently or synchronously; furthermore, each section includes its own flexible clock generator and extensive error-checking logic. As data passes through the McASP, it can be realigned so that the fixed-point representation used by application code can be independent of the representation used by the external devices without requiring any CPU overhead to make the conversion.

As was previously mentioned, the DSP may be configured to perform a method for frequency domain amplitude modulation as describe herein. For example, software instructions implementing the method may be stored in the ROM and executed by the CPU to perform amplitude modulation on audio signals received from one or more of the peripheral interface ports.

Other Embodiments

While the invention has been described with respect to a limited number of embodiments, those skilled in the art, having benefit of this disclosure, will appreciate that other embodiments can be devised which do not depart from the scope of the invention as disclosed herein.

For example, in some embodiments, rather than using the over-lap save technique, the well-known overlap-add technique may be used. One of ordinary skill in the art will understand the modifications to the system of FIG. 1B and the method of FIG. 11 without need for a detailed explanation. In general, in the overlap-add technique, the input time domain block is padded with zeros to the FFT length, the FFT is applied to transform the extended block to the frequency domain, the frequency domain block is filtered, shifted, filtered, the carrier is added, and an IFFT is applied to transform the modulated block back to the time domain. Then, the final output block is generated by adding (overlapping) some portion of the IFFT result with a portion of the previously generated IFFT result. Thus, zero-padding would be added before the FFT in FIG. 1B and FIG. 11 and overlapping would be added after the IFFT in FIG. 1B and FIG. 11.

Embodiments of the frequency domain amplitude modulation systems and methods described herein may be used in many different types of digital systems incorporating parametric speakers, e.g., digital audio players, personal computers, laptop computers, tablet computers with multimedia capabilities, and consumer systems such as video telephones, ticket machines, bank ATMs, etc. In such digital systems, embodiments of the systems and methods may be implemented in hardware, software, firmware, or any combination thereof. The methods may be executed in one or more processors, such as a microprocessor, application specific integrated circuit (ASIC), field programmable gate array (FPGA), digital signal processor (DSP), or a system on a chip (SoC) combining one or more such processors with specialized programmable accelerators. Any software instructions may be stored in onboard or external memory and executed by the one or more processors.

Any software instructions may be initially stored in a computer-readable medium and loaded and executed in the processor. In some cases, the software instructions may also be sold in a computer program product, which includes the computer-readable medium and packaging materials for the computer-readable medium. In some cases, the software instructions may be distributed via removable computer readable media, via a transmission path from computer readable media on another digital system, etc. Examples of computer-readable media include non-writable storage media such as read-only memory devices, writable storage media such as disks, flash memory, memory, or a combination thereof.

It is therefore contemplated that the appended claims will cover any such modifications of the embodiments as fall within the true scope of the invention.

What is claimed is:

1. A method of a signal processor of amplitude modulation of an audio signal with a carrier signal having a carrier frequency in a parametric speaker system, the method comprising:
   receiving, via the signal processor, a time domain sample block of the audio signal;
   overlapping the time domain sample block with a previous time domain sample block to generate an extended time domain sample block;
   applying a fast Fourier transform (FFT) to the extended time domain sample block to generate a frequency domain sample block;
   shifting a spectrum of the frequency domain sample block to generate a double sideband (DSB) frequency domain sample block, wherein a spectrum of the DSB frequency domain sample block consists of an upper sideband (USB) and a lower sideband (LSB) centered on a frequency of the carrier signal;
   applying a filter to the DSB frequency domain sample block using point-wise multiplication to generate a truncated DSB (TDSB) frequency domain sample block, wherein the filter truncates one selected from a group consisting of the LSB and the USB;
   adding the carrier signal to the TDSB frequency to generate an amplitude modulated (AM) TDSB frequency domain sample block;
   applying an inverse FFT to the AM-TDSB frequency domain sample block to generate an AM-TDSB time domain sample block; and
   extracting a center set of samples of the AM-TDSB time domain sample block, wherein the center set of samples is a same size as the received time domain sample block.

2. The method of claim 1, wherein adding the carrier signal comprises:
   adding a value of 1 to a sample value of the TDSB frequency domain sample block corresponding to a positive frequency of the carrier frequency;
   adding a value of 1 to a sample value of the TDSB frequency domain sample block corresponding to negative frequency of the carrier frequency; and
   wherein all other sample values in the TDSB frequency domain sample block are not changed.

3. The method of claim 1, wherein adding the carrier signal comprises:
   adjusting sample values of the carrier signal based on a maximum envelope value of the time domain sample block.

4. The method of claim 3, wherein adding the carrier signal comprises:
   adjusting the sample values of the carrier signal based on the maximum envelope value of the time domain sample block and a maximum envelope value of the previous time domain sample block.

5. The method of claim 1, wherein adding the carrier signal comprises:
   determining a maximum envelope value of the time domain sample block;
   adding the maximum envelope value to a sample value of the TDSB frequency domain sample block corresponding to a positive frequency of the carrier frequency;
   adding the maximum envelope value to a sample value of the TDSB frequency domain sample block corresponding to negative frequency of the carrier frequency; and
   wherein all other sample values in the TDSB frequency domain sample block are not changed.

6. The method of claim 1, wherein adding the carrier signal comprises:
   adding $$\frac{e_{r-1} + e_r}{2}$$

to sample values of the TDSB frequency domain sample block corresponding to a frequency and another frequency of the carrier signal;
   subtracting $$j\frac{e_{r-1} - e_r}{4}$$

from the sample values of the TDSB frequency domain sample block immediately preceding the sample values of the TDSB frequency domain sample block corresponding to the frequency and the other frequency of the carrier signal; and
   adding $$j\frac{e_{r-1} - e_r}{4}$$

to the sample values of the TDSB frequency domain sample block immediately following the sample values of the TDSB frequency domain sample block corresponding to the frequency and the other frequency of the carrier signal, wherein $j^2=-1$, $e_r$ is a maximum envelope value of the time domain sample block, and $e_{r-1}$ is a maximum envelope value of the previous time domain sample block.

7. The method of claim 1, further comprising:
oversampling the audio signal to convert a sampling rate of the audio signal to an ultrasonic sampling rate.

8. The method of claim 7, further comprising:
applying a low pass filter to the frequency domain sample block using point-wise multiplication, wherein the low-pass filter is designed to suppress mirror images caused by the oversampling.

9. The method of claim 1, further comprising applying a low-pass filter to mitigate aliasing in the shifting.

10. The method of claim 1, wherein the time domain sample block and the previous time domain sample block are overlapped by 50% to generate the extended time domain sample block.

11. A method of a signal processor of amplitude modulation of an audio signal with a carrier signal having a carrier frequency in a parametric speaker system, the method comprising:
Receiving, via the signal processor, a time domain sample block of the audio signal;
applying a fast Fourier transform (FFT) to the time domain sample block to generate a frequency domain sample block, wherein the time domain sample block is padded with zeros to a length of the FFT;
shifting a spectrum of the frequency domain sample block to generate a double sideband (DSB) frequency domain sample block, wherein a spectrum of the DSB frequency domain sample block consists of an upper sideband (USB) and a lower sideband (LSB) centered on a frequency of the carrier signal;
applying a filter to the DSB frequency domain sample block using point-wise multiplication to generate a truncated DSB (TDSB) frequency domain sample block, wherein the filter truncates one selected from a group consisting of the LSB and the USB;
adding a form of the carrier signal in the frequency domain to the TDSB frequency to generate an amplitude modulated (AM) TDSB frequency domain sample block;
applying an inverse FFT to the AM-TDSB frequency domain sample block to generate an AM-TDSB time domain sample block; and
overlapping a portion of the AM-TDSB time domain sample block with a portion of an AM-TDSB time domain sample block generated for a previous time domain sample block to generate a final output sample block of a same size as the received time domain sample block.

12. The method of claim 11, wherein adding the carrier signal comprises:
adding a value of 1 to a sample value of the TDSB frequency domain sample block corresponding to a positive frequency of the carrier frequency;
adding a value of 1 to a sample value of the TDSB frequency domain sample block corresponding to negative frequency of the carrier frequency; and
wherein all other sample values in the TDSB frequency domain sample block are not changed.

13. The method of claim 11, wherein adding the carrier signal comprises:
adjusting sample values of the carrier signal based on a maximum envelope value of the time domain sample block.

14. The method of claim 11, wherein adding the carrier signal having a carrier frequency comprises:

determining a maximum envelope value of the time domain sample block;
adding the maximum envelope value to a sample value of the TDSB frequency domain sample block corresponding to a positive frequency of the carrier frequency;
adding the maximum envelope value to a sample value of the TDSB frequency domain sample block corresponding to negative frequency of the carrier frequency; and
wherein all other sample values in the TDSB frequency domain sample block are not changed.

15. A signal processor for a parametric speaker system, the signal processor comprising:
a central processing unit;
an audio port configured to receive an audio signal; and
a memory coupled to the central processing unit, wherein the memory is configured to store software instructions that, when executed by the central processing unit, cause the signal processor to perform amplitude modulation of the audio signal with a carrier signal, the amplitude modulation comprising:
receiving a time domain sample block of the audio signal;
overlapping the time domain sample block with a previous time domain sample block to generate an extended time domain sample block;
applying a fast Fourier transform (FFT) to the extended time domain sample block to generate a frequency domain sample block;
shifting a spectrum of the frequency domain sample block to generate a double sideband (DSB) frequency domain sample block, wherein a spectrum of the DSB frequency domain sample block consists of an upper sideband (USB) and a lower sideband (LSB) centered on a frequency of the carrier signal;
applying a filter to the DSB frequency domain sample block using point-wise multiplication to generate a truncated DSB (TDSB) frequency domain sample block, wherein the filter truncates one selected from a group consisting of the LSB and the USB;
adding a form of the carrier signal in the frequency domain to the TDSB frequency domain sample block to generate an amplitude modulated (AM) TDSB frequency domain sample block;
applying an inverse FFT to the AM-TDSB frequency domain sample block to generate an AM-TDSB time domain sample block; and
extracting a center set of samples of the AM-TDSB time domain sample block, wherein the center set of samples is a same size as the received time domain sample block.

16. The signal processor of claim 15, wherein adding the carrier signal comprises:
adding a value of 1 to a sample value of the TDSB frequency domain sample block corresponding to a positive frequency of the carrier frequency;
adding a value of 1 to a sample value of the TDSB frequency domain sample block corresponding to negative frequency of the carrier frequency; and
wherein all other sample values in the TDSB frequency domain sample block are not changed.

17. The signal processor of claim 15, wherein adding the carrier signal comprises:
adjusting sample values of the carrier signal based on a maximum envelope value of the time domain sample block.

18. The signal processor of claim 17, wherein adding the carrier signal comprises:

adjusting sample values of the carrier signal based on the maximum envelope value of the time domain sample block and a maximum envelope value of the previous time domain sample block.

19. The signal processor of claim 15, wherein adding the carrier signal comprises:
determining a maximum envelope value of the time domain sample block;
adding the maximum envelope value to a sample value of the TDSB frequency domain sample block corresponding to a positive frequency of the carrier frequency;
adding the maximum envelope value to a sample value of the TDSB frequency domain sample block corresponding to negative frequency of the carrier frequency; and
wherein all other sample values in the TDSB frequency domain sample block are not changed.

20. The signal processor of claim 15, wherein adding the carrier signal comprises:
adding $$\frac{e_{r-1} + e_r}{2}$$

to sample values of the TDSB frequency domain sample block corresponding to a positive frequency and negative frequency of the carrier frequency;

subtracting $$j\frac{e_{r-1} - e_r}{4}$$

from the sample values of the TDSB frequency domain sample block immediately preceding the sample values of the TDSB frequency domain sample block corresponding to the frequency and the negative frequency of the carrier frequency; and
adding $$j\frac{e_{r-1} - e_r}{4}$$

to the sample values of the TDSB frequency domain sample block immediately following the sample values of the TDSB frequency domain sample block corresponding to the frequency and the negative frequency of the carrier frequency,
wherein $j^2 = -1$, $e_r$ is a maximum envelope value of the time domain sample block, and $e_{r-1}$ is a maximum envelope value of the previous time domain sample block.

* * * * *